(12) United States Patent
Ida et al.

(10) Patent No.: US 11,557,551 B2
(45) Date of Patent: Jan. 17, 2023

(54) INTEGRATED CIRCUIT WITH A RESISTIVE MATERIAL LAYER AND A BIPOLAR TRANSISTOR, AND PRODUCTION METHOD OF SAME

(71) Applicant: Nippon Telegraph and Telephone Corporation, Tokyo (JP)

(72) Inventors: Minoru Ida, Tokyo (JP); Yuta Shiratori, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 99 days.

(21) Appl. No.: 17/046,032

(22) PCT Filed: Apr. 15, 2019

(86) PCT No.: PCT/JP2019/016116
§ 371 (c)(1),
(2) Date: Oct. 8, 2020

(87) PCT Pub. No.: WO2019/208294
PCT Pub. Date: Oct. 31, 2019

(65) Prior Publication Data
US 2021/0028130 A1    Jan. 28, 2021

(30) Foreign Application Priority Data
Apr. 23, 2018   (JP) .............................. JP2018-082023

(51) Int. Cl.
*H01L 23/64*      (2006.01)
*H01L 21/48*      (2006.01)
(Continued)

(52) U.S. Cl.
CPC ........ *H01L 23/647* (2013.01); *H01L 21/4846* (2013.01); *H01L 23/36* (2013.01); *H01L 23/53242* (2013.01)

(58) Field of Classification Search
CPC ...................................................... H01L 23/647
(Continued)

(56) References Cited

U.S. PATENT DOCUMENTS

| | | | |
|---|---|---|---|
| 10,396,188 B1 * | 8/2019 | Yang | H01L 29/0649 |
| 10,515,872 B1 * | 12/2019 | Li | H01L 29/7371 |
| 2009/0078943 A1 * | 3/2009 | Ishida | H01L 21/84 |
| | | | 438/105 |

FOREIGN PATENT DOCUMENTS

| | | | |
|---|---|---|---|
| JP | 2001077204 A | | 3/2001 |
| JP | 2001156179 A | * | 6/2001 |
| JP | 2004127971 A | * | 4/2004 |

OTHER PUBLICATIONS

Thiam et al., "InP HBT Thermal Management by Transferring toHigh Thermal Conductivity Silicon Substrate," IEEE Electron Device Letters, vol. 35, No. 10, Oct. 2014, pp. 1010-1012.

* cited by examiner

*Primary Examiner* — Ajay Arora
(74) *Attorney, Agent, or Firm* — Slater Matsil, LLP (57) ABSTRACT

An integrated circuit includes a resistive material layer formed on a substrate, a metal layer formed on the resistive material layer, a bipolar transistor formed on the substrate, and a resistive element formed on the substrate. The bipolar transistor includes, as a sub-layer, the metal layer formed in a first region, and also includes a collector layer formed on the sub-collector layer. The resistive element is constituted by the resistive material layer formed in a second region.

9 Claims, 6 Drawing Sheets

(51) Int. Cl.
*H01L 23/36* (2006.01)
*H01L 23/532* (2006.01)
(58) Field of Classification Search
USPC .......................................................... 257/536
See application file for complete search history.

INTEGRATED CIRCUIT WITH A RESISTIVE MATERIAL LAYER AND A BIPOLAR TRANSISTOR, AND PRODUCTION METHOD OF SAME

CROSS-REFERENCE TO RELATED APPLICATIONS

This application is a national phase entry of PCT Application No. PCT/JP2019/016116, filed on Apr. 15, 2019, which claims priority to Japanese Application No. 2018-082023, filed on Apr. 23, 2018, which applications are hereby incorporated herein by reference.

TECHNICAL FIELD

The present invention relates to an integrated circuit in which a bipolar transistor and a resistive element are integrated, and a method for manufacturing the same.

BACKGROUND

In order to increase the speed of operation of a heterojunction bipolar transistor, it is essential to reduce the charge and discharge time of the internal capacitances of the elements, and for this purpose, it is effective to increase the operating current of the heterojunction bipolar transistor. However, if the operating current is increased, the temperature of the elements will increase due to the self-heating occurring inside the heterojunction bipolar transistor.

The increase in the temperature of the elements leads to deterioration in the electron transport properties within the elements, and increases the electron transit time of the heterojunction bipolar transistor, which cancels the effect of the reduction in the charge and discharge time made by the high current injection to some extent. Furthermore, the increase in the temperature of the elements also causes the serious problem that the operating life of the heterojunction bipolar transistor is reduced.

Accordingly, if the operating current of a heterojunction bipolar transistor is to be increased, consideration needs to be made so that the heterojunction bipolar transistor has a structure that ensures smooth heat dissipation.

Typically, heat generated in the elements of a heterojunction bipolar transistor is dissipated through interconnects connected to the heterojunction bipolar transistor or a substrate immediately beneath the elements. Particularly, heat dissipation through the substrate is important, and an effective measure for this is to use a substrate having a high thermal conductivity. For example, for a heterojunction bipolar transistor formed using an InP-type or GaAs-type semiconductor, an approach to epitaxially growing the above-described semiconductor on a Si-substrate that has a higher thermal conductivity than that of InP to form the heterojunction bipolar transistor has been reported.

However, epitaxial growth on a heterogeneous substrate has the problem that a dislocation or a defect occurs due to different lattice constants or thermal expansion coefficients, and thus sufficient crystalline quality cannot be obtained. In order to perform high-quality crystal growth on a heterogeneous substrate, a need arises to grow a thick buffer layer for reducing a lattice constant difference before epitaxially growing the heterojunction bipolar transistor structure. Such a buffer layer has a lower thermal conductivity than that of the substrate, and consequently has the essential problem that high crystalline quality and high heat dissipation performance cannot be compatible with each other.

As a method for obtaining a crystal structure of a heterojunction bipolar transistor that can have both high crystalline quality and high heat dissipation performance, a method as described below has been proposed. First, of the layer structure of the heterojunction bipolar transistor, the layers except for a sub-collector layer are epitaxially grown upside down on a lattice-matched compound semiconductor substrate. Then, they are combined with a high heat dissipation substrate in the wafer level, the compound semiconductor substrate is removed, and the layer structure is processed, thereby forming the heterojunction bipolar transistor (see Non Patent Literature 1).

In this method, the sub-collector layer, which is epitaxially grown in a case of a typical heterojunction bipolar transistor, is made of metal having a high thermal conductivity, and this sub-collector layer made of metal is used as an adhesion (joining) layer, thereby realizing excellent combining properties.

Figure 4:
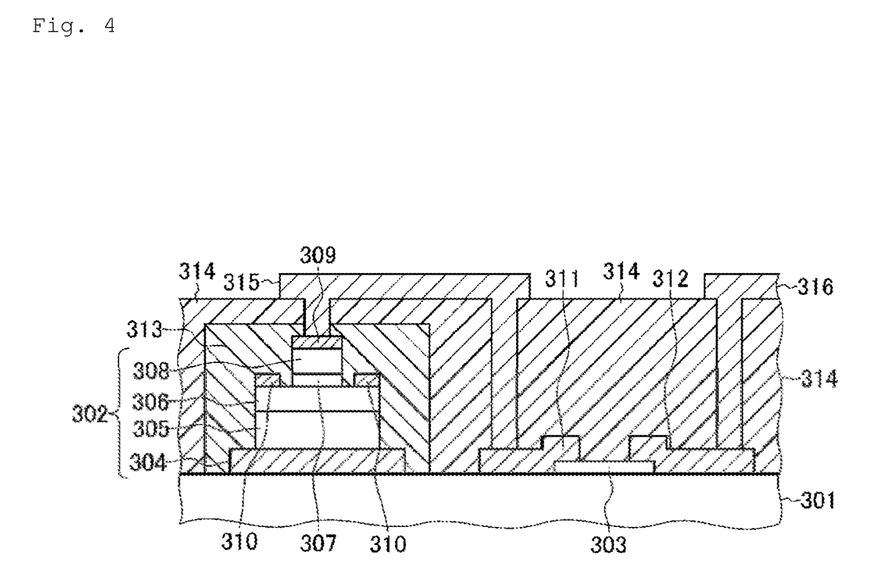
FIG. 4 is a cross-sectional view illustrating a configuration of a conventional integrated circuit.

An example of an integrated circuit in which this heterojunction bipolar transistor is integrated will be described with reference to FIG. 4 (see Patent Literature 1). In this integrated circuit, a heterojunction bipolar transistor 302 and a resistive element 303 are integrated on a high heat dissipation substrate 301. The heterojunction bipolar transistor 302 includes a sub-collector layer 304 made of metal, a collector layer 305, a base layer 306, an emitter layer 307, an emitter cap layer 308, an emitter electrode 309, and a base electrode 310. Furthermore, an interconnect 311 and an interconnect 312 are connected to the resistive element 303.

The heterojunction bipolar transistor 302 is protected by being covered with an element protection film 313. Furthermore, the heterojunction bipolar transistor 302 covered with the element protection film 313, and the resistive element 303 are covered with an interlayer dielectric film 314. The element protection film 313 and the interlayer dielectric film 314 are made of, for example, an organic resin.

Moreover, a connection interconnect 315 that is connected to the emitter electrode 309 and the interconnect 311 via through holes, a lead interconnect 316 that is connected to the interconnect 312 via a through hole, and the like are formed on the interlayer dielectric film 314.

Although, within the heterojunction bipolar transistor, self-heating occurs mainly in the collector layer, the sub-collector layer formed while being in contact with the collector layer, as well as the substrate formed while being in contact with the sub-collector layer are both made of a high thermal conductive material, and thus the heterojunction bipolar transistor consequently has very favorable heat dissipation performance. Furthermore, due to the epitaxial growth being performed on the lattice-matched compound semiconductor substrate, there is no problem in the crystalline quality of the compound semiconductor constituting the element portion.

CITATION LIST

Patent Literature

PTL 1 Japanese Patent Application Publication No. 2001-077204

Non Patent Literature

[PL 1—A. Thiam et al., "InP HBT Thermal Management by Transferring to High Thermal Conductivity Silicon Substrate", IEEE Electron Device Letters, vol. 35, no. 10, pp. 1010-1012, 2014.

SUMMARY

Technical Problem

The method in which the metal sub-collector layer is used as a adhesion layer to combine a wafer on which the heterojunction bipolar transistor layer structure is deposited with the supporting substrate having a high thermal conductivity is a means that is effective to realize both high crystalline quality and high heat dissipation performance, but additionally includes the steps of, for example, depositing a metal film for the sub-collector layer, combining the wafer with the substrate, and etching the compound semiconductor substrate, relative to a typical method for manufacturing a heterojunction bipolar transistor, causing the problem that the manufacturing process takes longer time.

There is furthermore the problem that, if an integrated circuit in which a resistive element and the like are integrated with the heterojunction bipolar transistor is manufactured, the process will take much longer time. As described above, if a resistive element is integrated, the resistive element is formed typically in such a manner that, after formation of a heterojunction bipolar transistor, a resistive material such as tungsten silicon nitride (WSiN) is deposited over the entire substrate to form a resistive material layer, and this resistive material layer is patterned. Because the resistive material layer cannot be brought into contact with the heterojunction bipolar transistor, as described with reference to FIG. 4, the element protection film 313 that covers the heterojunction bipolar transistor 302 is formed, and then the resistive material layer is formed, thereby forming the resistive element 303.

As described above, conventionally, when a heterojunction bipolar transistor is formed on a substrate having a high thermal conductivity in order to achieve high heat dissipation performance, and a resistive element and the like are further integrated, there is the problem that, due to the increased number of steps, the manufacturing process takes longer time.

Embodiments of the present invention were made to solve the aforementioned problems, and it is an object of embodiments of the present invention to enable a shorter process for manufacturing an integrated circuit in which a heterojunction bipolar transistor and a resistive element are integrated on a substrate having a high thermal conductivity.

Means for Solving the Problem

According to embodiments of the present invention, an integrated circuit includes: a resistive material layer that is made of a resistive material, is formed on a substrate, and includes a first region and a second region, which are separated from each other; a metal layer that is made of metal, and is formed on the resistive material layer so as to be in contact with the resistive material layer, the metal layer being formed in the first region and a third region, which is a part of the second region; a bipolar transistor that includes a collector layer formed on a sub-collector layer, with the metal layer in the first region serving as the sub-collector layer; a resistive element constituted by the resistive material layer in the second region; and an interconnect that is constituted by the metal layer in the third region, and is connected to the resistive element.

In the integrated circuit, the substrate may be made of a material that has heat dissipation performance higher than that of a semiconductor that constitutes the bipolar transistor.

In the integrated circuit, the metal may include gold.

In the integrated circuit, the resistive material may be a material that contains tungsten.

Furthermore, according to embodiments of the present invention, a method for manufacturing an integrated circuit includes: a first step of forming, on a substrate, a resistive material layer made of a resistive material; a second step of forming a metal layer made of metal on the resistive material layer so that the metal layer is in contact with the resistive material layer; a third step of forming, on the resistive material layer in a first region, a bipolar transistor that includes a collector layer; a fourth step of forming, by patterning the metal layer, a sub-collector layer that is connected to the collector layer in the first region, and an interconnect that is arranged in a third region, which is a part of a range of a second region, the second region being different from the first region; and a fifth step of forming, after having formed the sub-collector layer and the interconnect, a resistive element that is connected to the interconnect in the second region by patterning the resistive material layer.

In the method for manufacturing an integrated circuit, the substrate may be made of a material that has heat dissipation performance higher than that of a semiconductor that constitutes the bipolar transistor.

In the method for manufacturing an integrated circuit, the metal may include gold.

In the method for manufacturing an integrated circuit, the resistive material may be a material that contains tungsten.

Effects of Embodiments of the Invention

As described above, according to embodiments of the present invention, since the resistive element is constituted by the resistive material layer arranged closer to the substrate than the heterojunction bipolar transistor, it is possible to achieve an advantageous effect of enabling a shorter process for manufacturing an integrated circuit in which a heterojunction bipolar transistor and a resistive element are integrated on a substrate having a high thermal conductivity.

DETAILED DESCRIPTION OF ILLUSTRATIVE EMBODIMENTS

Hereinafter, an integrated circuit according to an embodiment of the present invention will be described with reference to FIG. 1. This integrated circuit includes a substrate 101, a resistive material layer 102 formed on the substrate 101, a metal layer 103 formed on the resistive material layer 102, a bipolar transistor 104 formed on the substrate 101, and a resistive element 105 formed on the substrate 101.

The resistive material layer 102 is made of a resistive material for forming the later-described resistive element 105, and is, for example, made of a material that contains tungsten such as WSiN. Also, the resistive material layer 102 is formed in a first region 151 and a second region 152, which are separated from each other.

The metal layer 103 is made of metal such as Au, and is formed on the resistive material layer 102 so as to be in contact therewith. Also, the metal layer 103 is formed in the first region 151, and a third region 153, which is a part of the second region 152. Furthermore, in the embodiment, the metal layer 103 is also formed in a fourth region 154, which is a part of the second region 152. The third region 153 has an area smaller than that of the second region 152, and is formed within the second region 152.

The bipolar transistor 104 is formed in the first region 151. The bipolar transistor 104 includes a sub-collector layer 107, a collector layer 108, a base layer 109, an emitter layer 110, and an emitter cap layer 111. Furthermore, an emitter electrode 112 is formed on the emitter cap layer 111, and a base electrode 113 is formed on the base layer 109 while surrounding the emitter layer 110. Furthermore, the sub-collector layer 107 is constituted by the metal layer 103 in the first region 151. The bipolar transistor 104 is a heterojunction bipolar transistor made of a well-known compound semiconductor.

The resistive element 105 is constituted by the resistive material layer 102 in the second region 152. Note that a resistive layer 102a, which is constituted by the resistive material layer 102 in the first region 151, is formed under the sub-collector layer 107. Also, an interconnect 106 is constituted by the metal layer 103 in the third region 153, and is connected to an end of the resistive element 105. Also, in the embodiment, an interconnect 116 is connected to the other end of the resistive element 105. The interconnect 116 is constituted by the resistive material layer 102 in the fourth region 154.

Furthermore, in the embodiment, an interlayer dielectric film 115 is provided covering the bipolar transistor 104, the resistive element 105, the interconnect 106, and the interconnect 116. Also, a connection interconnect 117 is formed on the interlayer dielectric film 115, the connection interconnect 117 being connected to the emitter electrode 112 and the interconnect 106 via through holes formed in the interlayer dielectric film 115. A lead interconnect 118 is also formed on the interlayer dielectric film 115, the lead interconnect 118 being connected to the interconnect 116 via a through hole formed in the interlayer dielectric film 115.

The following will describe a method for manufacturing the integrated circuit according to the embodiment of the present invention with reference to FIGS. 2A to 2E.

Figure 2A:
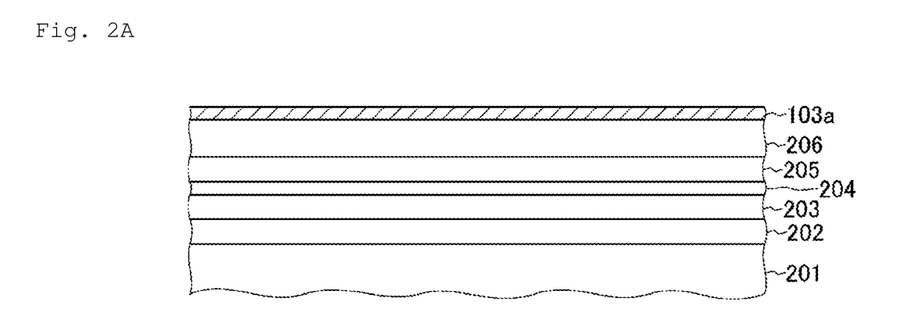
FIG. 2A is a cross-sectional view in a state of a midway process, for illustrating a method for manufacturing the integrated circuit according to the embodiment of the present invention.

Furthermore, as shown in FIG. 2A, a growth substrate 201 made of a compound semiconductor such as InP or GaAs is prepared, and a first semiconductor layer 202, a second semiconductor layer 203, a third semiconductor layer 204, a fourth semiconductor layer 205, and a fifth semiconductor layer 206 are sequentially formed on the growth substrate 201.

The first semiconductor layer 202 has an InGaAs layer on the growth substrate 201 side, and an InP layer on the second semiconductor layer 203 side. The first semiconductor layer 202 is an etch stop layer. The second semiconductor layer 203 is a layer to serve as an emitter cap layer, and is made of, for example, heavily-n-doped InGaAs. The third semiconductor layer 204 is a layer to serve as an emitter layer, and is made of, for example, InP. The fourth semiconductor layer 205 is a layer to serve as a base layer, and is made of, for example, heavily-p-doped InGaAs. The fifth semiconductor layer 206 is a layer to serve as a collector layer, and is made of, for example, InP. They may be formed by being sequentially epitaxially grown through a well-known metal organic chemical vapor deposition.

Furthermore, a first metal layer 103a is formed on the fifth semiconductor layer 206. The first metal layer 103a is a layer to serve as the sub-collector layer 107, and is made of, for example, Au or an Au alloy. The first metal layer 103a may be made of an alloy of a plurality of types of metal, or may be a multilayer film made of a plurality of types of metal. Specifically, the side of the first metal layer 103a that is in contact with the fifth semiconductor layer 206, which is to serve as the collector layer, is preferably made of a material that can favorably come into contact with the semiconductor, and is preferably made of, for example, titanium, platinum, tungsten, molybdenum, or an alloy that contains any of them. On the other hand, the surface side of the first metal layer 103a is to serve as a face (combining face) for later-described combining, and thus is preferably made of Au or an Au alloy, with which it is easy to realize excellent adhesiveness. The first metal layer 103a may be formed by a sputtering method or a vacuum vapor deposition method.

Figure 2B:
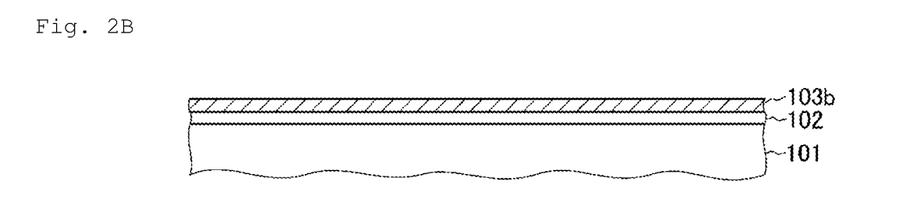
FIG. 2B is a cross-sectional view in a state of the midway process, for illustrating the method for manufacturing the integrated circuit according to the embodiment of the present invention.

On the other hand, as shown in FIG. 2B, the resistive material layer 102 is formed on the substrate 101 (first step). The substrate 101 is made of Si or SiC, which is highly resistive and has a high thermal conductivity. The substrate 101 may be made of a material that has heat dissipation performance (thermal conductivity) higher than that of the semiconductor that constitutes the bipolar transistor. The resistive material layer 102 may be formed by depositing a material that contains tungsten, such as WSiN, using a sputtering method or the like.

Then, a second metal layer 103b is formed on the resistive material layer 102 so as to be in contact therewith. The second metal layer 103b is similar to the first metal layer 103a, and is preferably made of Au or an Au alloy. Specifically, the surface side of the second metal layer 103b that is to serve as the combining face is preferably made of Au or an Au alloy, with which it is easy to realize excellent adhesiveness.

Figure 2C:
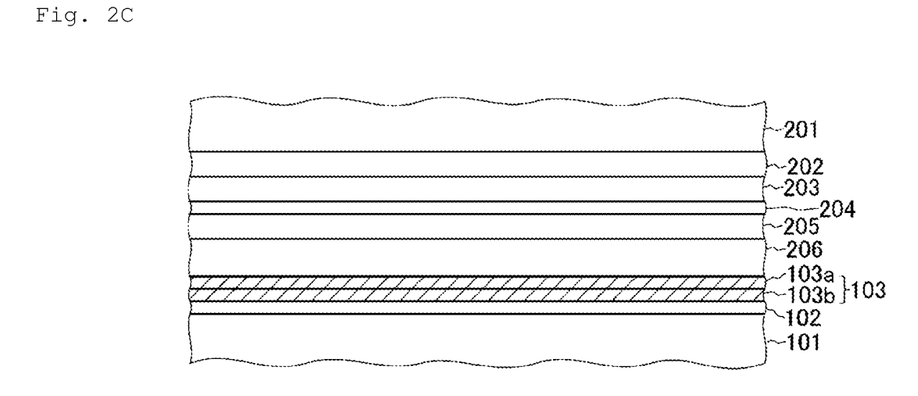
FIG. 2C is a cross-sectional view in a state of the midway process, for illustrating the method for manufacturing the integrated circuit according to the embodiment of the present invention.

Then, as shown in FIG. 2C, the growth substrate 201 and the substrate 101 are combined with each other, by joining the first metal layer 103a and the second metal layer 103b to each other. The above-described joining may be performed using, for example, a well-known surface activation joining method. With this joining, the metal layer 103 constituted by the joined first metal layer 103a and second metal layer 103b is formed on the substrate 101 (second step).

Then, the growth substrate 201 is removed. For example, a hydrochloric acid-type etchant is used to selectively etch off the growth substrate 201 made of InP. In this etching treatment, the InGaAs layer, on the growth substrate 201 side, of the first semiconductor layer 202 serves as an etch stop layer. Note that the above-described selective etching may also be executed, after the growth substrate 201 is ground and polished using a well-known abrasive method or the like so that it is thin to a certain extent. Then, citric acid-type etching solution is used to selectively etch off the InGaAs layer of the first semiconductor layer 202. In this etching, the InP layer of the first semiconductor layer 202 serves as an etch stop layer. Then, a hydrochloric acid-type etchant is used again to selectively etch off the InP layer of the first semiconductor layer 202. In this etching, the second semiconductor layer 203 made of InGaAs serves as an etch stop layer.

Figure 2D:
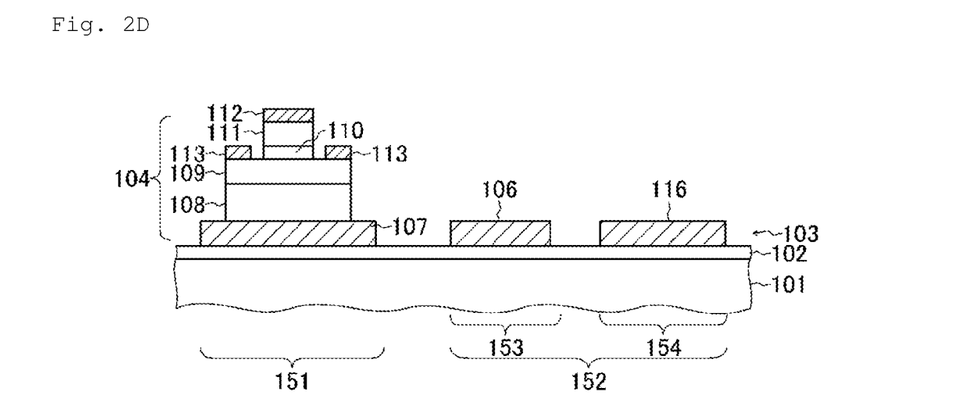
FIG. 2D is a cross-sectional view in a state of the midway process, for illustrating the method for manufacturing the integrated circuit according to the embodiment of the present invention.

Then, as shown in FIG. 2D, the collector layer 108, the base layer 109, the emitter layer 110, and the emitter cap layer 111 are formed, by patterning the first semiconductor layer 202, the second semiconductor layer 203, the third semiconductor layer 204, the fourth semiconductor layer 205, and the fifth semiconductor layer 206 using a well-known lithographic technique and a well-known etching technique. The etching treatment for each layer may employ a selective wet etching method, inductively-coupled plasma (ICP) etching method, or the like. Furthermore, the emitter electrode 112 and the base electrode 113 are formed, thereby forming the bipolar transistor 104 (third step). The formation of the emitter electrode 112 and the base electrode 113 may employ, for example, a vacuum vapor deposition method and a liftoff method.

Then, the sub-collector layer 107, the interconnect 106, and the interconnect 116 are formed at the same time by patterning the metal layer 103 (fourth step). As described above, the sub-collector layer 107 is connected to the collector layer 108 in the first region 151, and the interconnect 106 is arranged in the third region 153.

In the etching treatment used in this patterning, it is important to use an etching method that can obtain a sufficient selection ratio such that the lower resistive material layer 102 is not etched. For example, if the metal layer 103 is made of Au, and the resistive material layer 102 is made of an alloy whose main component is tungsten, a reactive ion etching method using argon gas and oxygen gas is executed so that the metal layer 103 is selectively etched. Selective wet etching may also be used.

Figure 2E:
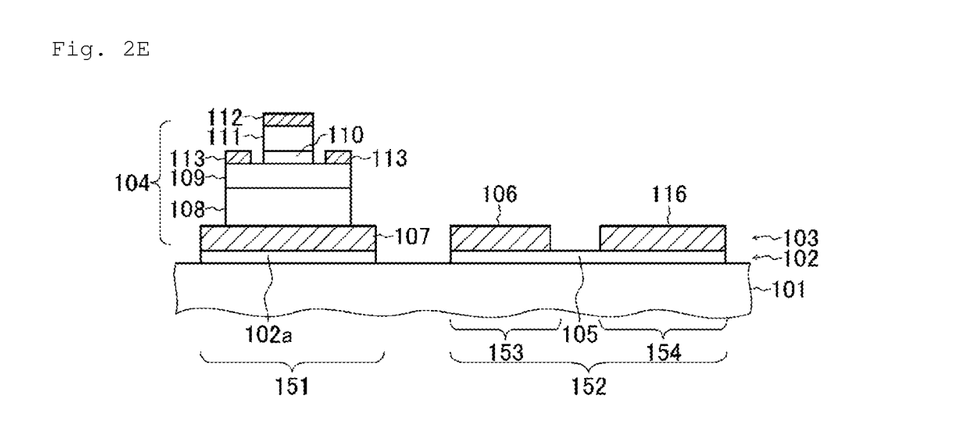
FIG. 2E is a cross-sectional view in a state of the midway process, for illustrating the method for manufacturing the integrated circuit according to the embodiment of the present invention.

As shown in FIG. 2E, the resistive element 105 that is connected to the interconnect 106 in the second region 152 is formed, by patterning the resistive material layer 102 after having formed the sub-collector layer 107, the interconnect 106, and the interconnect 116 in the above-described manner (fifth step). The etching treatment used in this patterning may employ, for example, well-known reactive ion etching.

Note that, in this patterning, the resistive layer 102a constituted by the resistive material layer 102 in the first region 151 is formed under the sub-collector layer 107.

Figure 1:
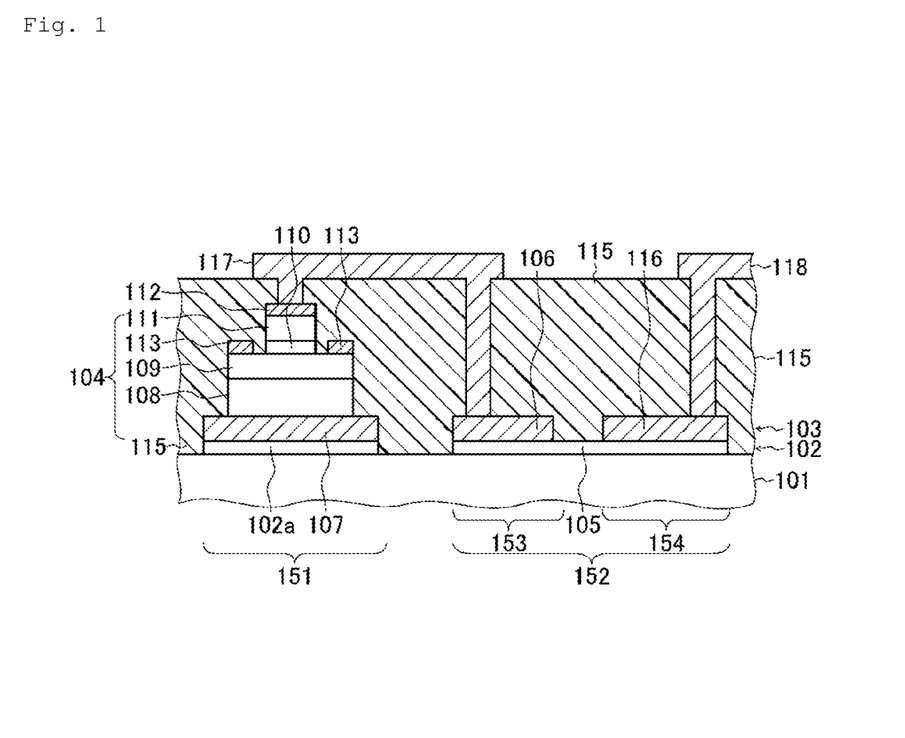
FIG. 1 is a cross-sectional view illustrating a configuration of an integrated circuit according to an embodiment of the present invention.

After the bipolar transistor 104, the interconnect 106 (interconnect 116), and the resistive element 105 have been formed in the above-described manner, the interlayer dielectric film 115 is formed, the contact holes are formed at predetermined positions in the interlayer dielectric film 115, and then the connection interconnect 117 and the lead interconnect are formed, as shown in FIG. 1. They may be formed by a well-known method for manufacturing a semiconductor device.

As described above, according to the embodiment, since the bipolar transistor 104 is formed in a state in which the resistive material layer 102 has already been formed, it is not necessary to form an element protection film for protecting only the element portion of the bipolar transistor 104, and thus a step for forming this element protection film can be omitted. As a result, it is possible to achieve a shorter process for manufacturing an integrated circuit in which a heterojunction bipolar transistor and a resistive element are integrated on a substrate having a high thermal conductivity.

The following will describe another method for manufacturing the integrated circuit according to an embodiment of the present invention, with reference to FIGS. 3A to 3D.

Figure 3A:
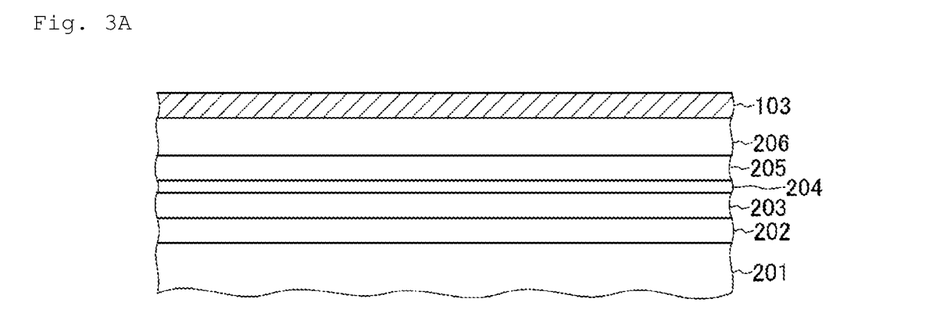
FIG. 3A is a cross-sectional view in a state of a midway process, for illustrating another method for manufacturing the integrated circuit according to an embodiment of the present invention.

First, as shown in FIG. 3A, the growth substrate 201 made of a compound semiconductor such as InP or GaAs is prepared, and the first semiconductor layer 202, the second semiconductor layer 203, the third semiconductor layer 204, the fourth semiconductor layer 205, and the fifth semiconductor layer 206 are sequentially formed on the growth substrate 201. This is the same procedure as the manufacturing method described with reference to FIG. 2A. In this example, the metal layer 103 is formed on the fifth semiconductor layer 206.

Figure 3B:
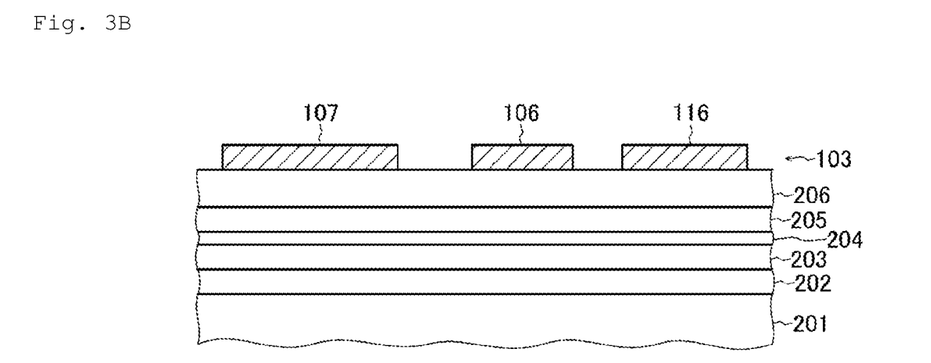
FIG. 3B is a cross-sectional view in a state of the midway process, for illustrating the other method for manufacturing the integrated circuit according to the embodiment of the present invention.

Then, as shown in FIG. 3B, the sub-collector layer 107, the interconnect 106, and the interconnect 116 are formed at the same time by patterning the metal layer 103.

Figure 3C:
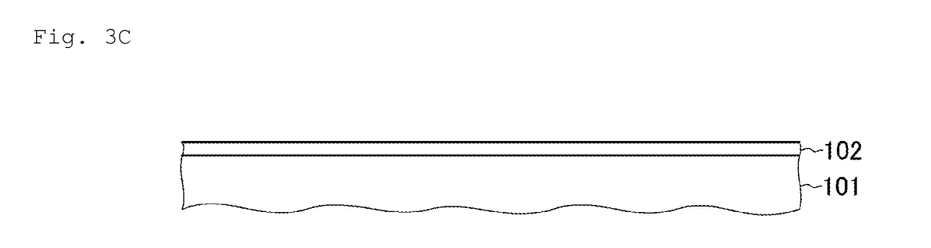
FIG. 3C is a cross-sectional view in a state of the midway process, for illustrating the other method for manufacturing the integrated circuit according to the embodiment of the present invention.

On the other hand, as shown in FIG. 3C, the resistive material layer 102 is formed on the substrate 101.

Figure 3D:
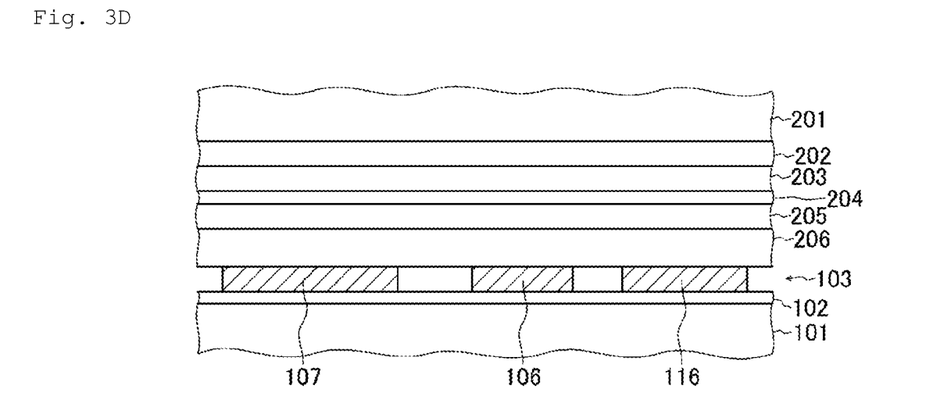
FIG. 3D is a cross-sectional view in a state of the midway process, for illustrating the other method for manufacturing the integrated circuit according to the embodiment of the present invention.

Then, as shown in FIG. 3D, the growth substrate 201 and the substrate 101 are combined with each other, by joining the metal layer 103 in which the sub-collector layer 107, the interconnect 106, and the interconnect 116 are formed to the resistive material layer 102. If sufficient adhesiveness is ensured, such joining of the metal layer 103 in which the sub-collector layer 107, the interconnect 106, and the interconnect 116 are formed to the resistive material layer 102 may be performed. In this example, the second metal layer 103b, which has been described with reference to FIG. 2B, does not need to be formed, and thus it is expected that the process can further be shortened.

Then, similar to the description above, the growth substrate 201 is removed, and the first semiconductor layer 202 is removed. Then, similar to the description above, the emitter electrode 112 and the base electrode 113 are formed by patterning the first semiconductor layer 202, the second semiconductor layer 203, the third semiconductor layer 204, the fourth semiconductor layer 205, and the fifth semiconductor layer 206 using a well-known lithographic technique and a well-known etching technique, thereby forming the bipolar transistor 104. In this example, in this stage, the sub-collector layer 107, the interconnect 106, and the interconnect 116 are already formed.

Then, similar to the description above, the resistive element 105 that is connected to the interconnect 106 is formed by patterning the resistive material layer 102, the interlayer dielectric film 115 is formed, the contact holes are formed at predetermined positions in the interlayer dielectric film 115, and then the connection interconnect 117 and the lead interconnect 118 are formed.

Also in this example of the manufacturing method, since the bipolar transistor 104 is formed in a state in which the resistive material layer 102 has already been formed, it is not necessary to form an element protection film for protecting only the element portion of the bipolar transistor 104, and thus a step for forming this element protection film can be omitted. As a result, it is possible to achieve a shorter process for manufacturing an integrated circuit in which a heterojunction bipolar transistor and a resistive element are integrated on a substrate having a high thermal conductivity.

As described above, according embodiments of to the present invention, since the resistive element is constituted by the resistive material layer arranged closer to the substrate than the heterojunction bipolar transistor, it is possible to further shorten the process for manufacturing an integrated circuit in which a heterojunction bipolar transistor and a resistive element are integrated on a substrate having a high thermal conductivity.

Note that the present invention is not limited to the above-described embodiments, and it is apparent that a person having ordinary skill in the art to which the present invention pertains can execute various modifications and combinations within the scope of the technical idea of the present invention.

REFERENCE SIGNS LIST

101 Substrate
102 Resistive material layer
102a Resistive layer
103 Metal layer
104 Bipolar transistor
105 Resistive element
106 Interconnect
107 Sub-collector layer
108 Collector layer
109 Base layer
110 Emitter layer
11 Emitter cap layer
112 Emitter electrode
113 Base electrode
115 Interlayer dielectric film
116 Interconnect
117 Connection interconnect
118 Lead interconnect
151 First region
152 Second region
153 Third region
154 Fourth region.

The invention claimed is:

1. An integrated circuit comprising:
a resistive material layer on and in contact with a substrate, wherein the resistive material layer includes a first region and a second region separated from the first region, wherein the second region of the resistive material layer provides a resistive element, wherein the resistive material layer has a same material composition throughout;
a metal layer on and in contact with the resistive material layer, the metal layer being on the first region and a third region of the resistive material layer, wherein the third region is a part of the second region, and wherein a first portion of the metal layer on the third region provides an interconnect connected to the resistive element; and
a bipolar transistor comprising a collector layer on a sub-collector layer, wherein a second portion of the metal layer on the first region provides the sub-collector layer, wherein the collector layer is in contact with the sub-collector layer.

2. The integrated circuit according to claim 1, wherein the substrate is made of a material that has heat dissipation performance higher than that of a semiconductor material comprised by the bipolar transistor.

3. The integrated circuit according to claim 1, wherein the metal layer comprises gold.

4. The integrated circuit according to claim 1, wherein the resistive material layer comprises tungsten.

5. The integrated circuit according to claim 1, wherein a top surface of the interconnect is level with an interface between the sub-collector layer and the collector layer.

6. A method for manufacturing an integrated circuit, the method comprising:
forming, on and in contact with a substrate, a resistive material layer made of a resistive material, wherein the resistive material layer has a same material composition throughout;
forming a metal layer on and in contact with the resistive material layer;
forming, on the resistive material layer in a first region, a bipolar transistor that includes a collector layer;
patterning the metal layer to define:
a sub-collector layer in the first region that is in contact with the collector layer; and
an interconnect in a third region, wherein the third region is part of a second region that is different from the first region; and
after forming the sub-collector layer and the interconnect, patterning the resistive material layer to define a resistive element in the second region and that is connected to the interconnect.

7. The method for manufacturing an integrated circuit according to claim 6, wherein the substrate is made of a material that has heat dissipation performance higher than that of a semiconductor material comprised by the bipolar transistor.

8. The method for manufacturing an integrated circuit according to claim 6, wherein the metal layer comprises gold.

9. The method for manufacturing an integrated circuit according claim 6, wherein the resistive material comprises tungsten.

* * * * *